(12) United States Patent
Chang et al.

(10) Patent No.: US 12,217,795 B2
(45) Date of Patent: Feb. 4, 2025

(54) MEMORY AND OPERATING METHOD THEREOF

(71) Applicants: TAIWAN SEMICONDUCTOR MANUFACTURING COMPANY, LTD., Hsinchu (TW); NATIONAL TSING HUA UNIVERSITY, Hsinchu (TW)

(72) Inventors: Meng-Fan Chang, Taichung (TW); Yen-Cheng Chiu, Hsinchu (TW)

(73) Assignees: TAIWAN SEMICONDUCTOR MANUFACTURING COMPANY, LTD., Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 18/595,188

(22) Filed: Mar. 4, 2024

(65) Prior Publication Data
US 2024/0203491 A1    Jun. 20, 2024

Related U.S. Application Data

(63) Continuation of application No. 17/705,306, filed on Mar. 26, 2022, now Pat. No. 11,996,147.
(Continued)

(51) Int. Cl.
G11C 7/08    (2006.01)
G11C 13/00    (2006.01)
H03K 19/20    (2006.01)

(52) U.S. Cl.
CPC ........ *G11C 13/004* (2013.01); *G11C 13/0004* (2013.01); *G11C 7/08* (2013.01); *H03K 19/20* (2013.01)

(58) Field of Classification Search
CPC ...................................................... G11C 7/08
See application file for complete search history.

(56) References Cited

U.S. PATENT DOCUMENTS 10,998,018 B1    5/2021    Ranjan et al.
2013/0163321 A1    6/2013    Lam et al.
(Continued)

OTHER PUBLICATIONS

Taehoon Kim et al., "Evolution of Phase-Change Memory for the Storage-Class Memory and Beyond", IEEE Transactions on Electron Devices, vol. 67, No. 4, Apr. 2020, pp. 1394-1406.
(Continued)

*Primary Examiner* — Jason Lappas
(74) *Attorney, Agent, or Firm* — Maschoff Brennan

(57) ABSTRACT

A memory includes a memory device, a reading device and a feedback device. The memory device stores a plurality of bits. The reading device includes first and second reading circuits coupled to the memory device. The second reading circuit is coupled to the first reading circuit at a first node. The first and second reading circuits cooperates with each other to generate a first voltage signal at the first node based on at least one first bit of the plurality of bits. The feedback device adjusts at least one of the first reading circuit or the second reading circuit based on the first voltage signal. The first and second reading circuits generate a second voltage signal, different from the first voltage signal, corresponding to the bits, after the at least one of the first reading circuit or the second reading circuit is adjusted by the feedback device.

20 Claims, 7 Drawing Sheets

Related U.S. Application Data

(60) Provisional application No. 63/227,888, filed on Jul. 30, 2021.

(56) References Cited

U.S. PATENT DOCUMENTS

| | | | |
|---|---|---|---|
| 2014/0016404 A1 | 1/2014 | Kim et al. | |
| 2014/0204683 A1* | 7/2014 | Sahu .................. | G11C 7/08 365/189.11 |
| 2020/0051619 A1 | 2/2020 | Yamagami | |

OTHER PUBLICATIONS

Milos Stanisavljevic et al., "Phase-Change Memory: Feasibility of Reliable Multilevel-cell Storage and Retention at Elevated Temperatures", 2015 IEEE International Reliability Physics Symposium, pp. 5B 6.1-5B 6.6, Apr. 19, 2015.

* cited by examiner

//MEMORY AND OPERATING METHOD THEREOF

PRIORITY CLAIM AND CROSS-REFERENCE

This application is a continuation application of U.S. application Ser. No. 17/705,306, filed on Mar. 26, 2022, which claims priority to U.S. Provisional Application No. 63/227,888, filed on Jul. 30, 2021, the entirety of which is herein incorporated by reference.

BACKGROUND

A memory is typically used to store data. To read the data stored in the memory, the memory generates a signal corresponding to data stored in the memory. A voltage level of the signal corresponds to a bit value of the data. Different bit values of the data correspond to different voltage levels of the signal. By analyzing the voltage levels of the signal, at least part of the data being read is able to be known.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
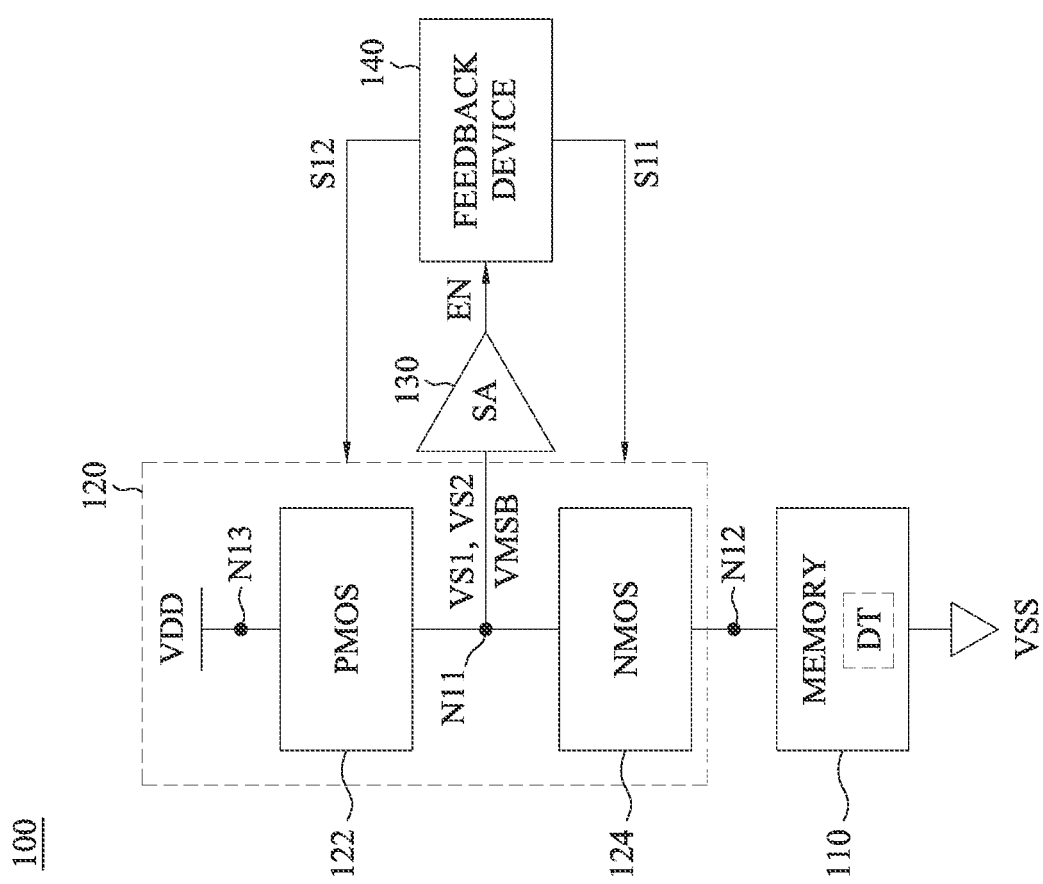
FIG. 1 is a schematic diagram of a memory in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a memory 100 in accordance with some embodiments of the present disclosure. As illustratively shown in FIG. 1, the memory 100 includes a memory device 110, a reading device 120, a sensing device 130 and a feedback device 140. In some embodiments, the memory device 110 is implemented as a phase change random access memory (PCRAM). In some embodiments, the reading device 120 is implemented as complementary metal oxide semiconductor (CMOS) circuit. In some embodiments, the sensing device 130 is implemented as a current sensing amplifier (SA).

In some embodiments, the memory device 110 is configured to store data DT including multiple bits, and configured to receive a voltage signal VSS. The data DT has various bit values in various embodiments. The reading device 120 is configured to read the data DT to generate a voltage signal VS1 corresponding to the data DT. The sensing device 130 is configured to generate digital signals EN based on the voltage signal VS1. The feedback device 140 is configured to generate control signals S11 and S12 based on the digital signals EN, to control the reading device 120 to generate a voltage signal VS2. The voltage signal VS2 also corresponds to the data DT.

As illustratively shown in FIG. 1, the reading device 120 includes reading circuits 122 and 124. The reading circuit 122 is configured to receive a voltage signal VDD different from the voltage signal VSS at a node N13, and coupled to the node N11. In some embodiments, the voltage signal VDD has a power supply voltage level, and the voltage signal VSS has a ground voltage level.

As illustratively shown in FIG. 1, the reading circuit 124 is coupled to the reading circuit 122 at the node N11, and coupled to the memory device 110 at a node N12. In some embodiments, the reading circuits 122 and 124 correspond to two transistor types, respectively. For example, the reading circuit 122 includes P-type Metal-Oxide-Semiconductor (PMOS) transistors, and the reading circuit 124 includes N-type Metal-Oxide-Semiconductor (NMOS) transistors.

In some embodiments, the reading circuits 122 and 124 are configured to cooperate with each other to generate the voltage signals VS1 and VS2 at the node N11 based on the data DT. As illustratively shown in FIG. 1, the reading circuits 122 and 124 are coupled in series between the nodes N12 and N13. In some embodiments, the voltage signals VS1 and VS2 depend on resistances of the reading circuits 122 and 124. For example, when the resistance of the reading circuit 122 is increased and/or the resistance of the reading circuit 124 is decreased, voltage levels of the voltage signals VS1 and VS2 are decreased. In contrast, when the resistance of the reading circuit 122 is decreased and/or the resistance of the reading circuit 124 is increased, the voltage levels of the voltage signals VS1 and VS2 are increased.

In some embodiments, the reading circuits 122 and 124 are configured to generate a voltage signal VMSB, which is an embodiment of the voltage signal VS1. The voltage signal VMSB corresponds to at least one bit, such as one or more most significant bit (MSB), of the data DT.

In some embodiments, the sensing device 130 is configured to generate digital signals EN based on the voltage signal VMSB. In some embodiments, the feedback device 140 is configured to, based on the digital signals EN, adjust the resistance of at least one of the reading circuits 122 and 124 to generate the voltage signal VS2, which has voltage levels at least partially different from the voltage levels of the voltage signal VS1.

For example, in response to the voltage signal VMSB having a first bit value, the feedback device 140 adjusts the reading circuit 122 by the control signal S12, and in response to the voltage signal VMSB having a second bit value different from the first bit value, the feedback device 140 adjusts the reading circuit 124 by the control signal S11.

In some embodiments, after at least one of the reading circuits 122 and 124 is adjusted by the feedback device 140, the reading circuits 122 and 124 generate the voltage signal VS2. In other words, the voltage signal VS2 is an adjusted version of the voltage signal VS1.

Figure 2:
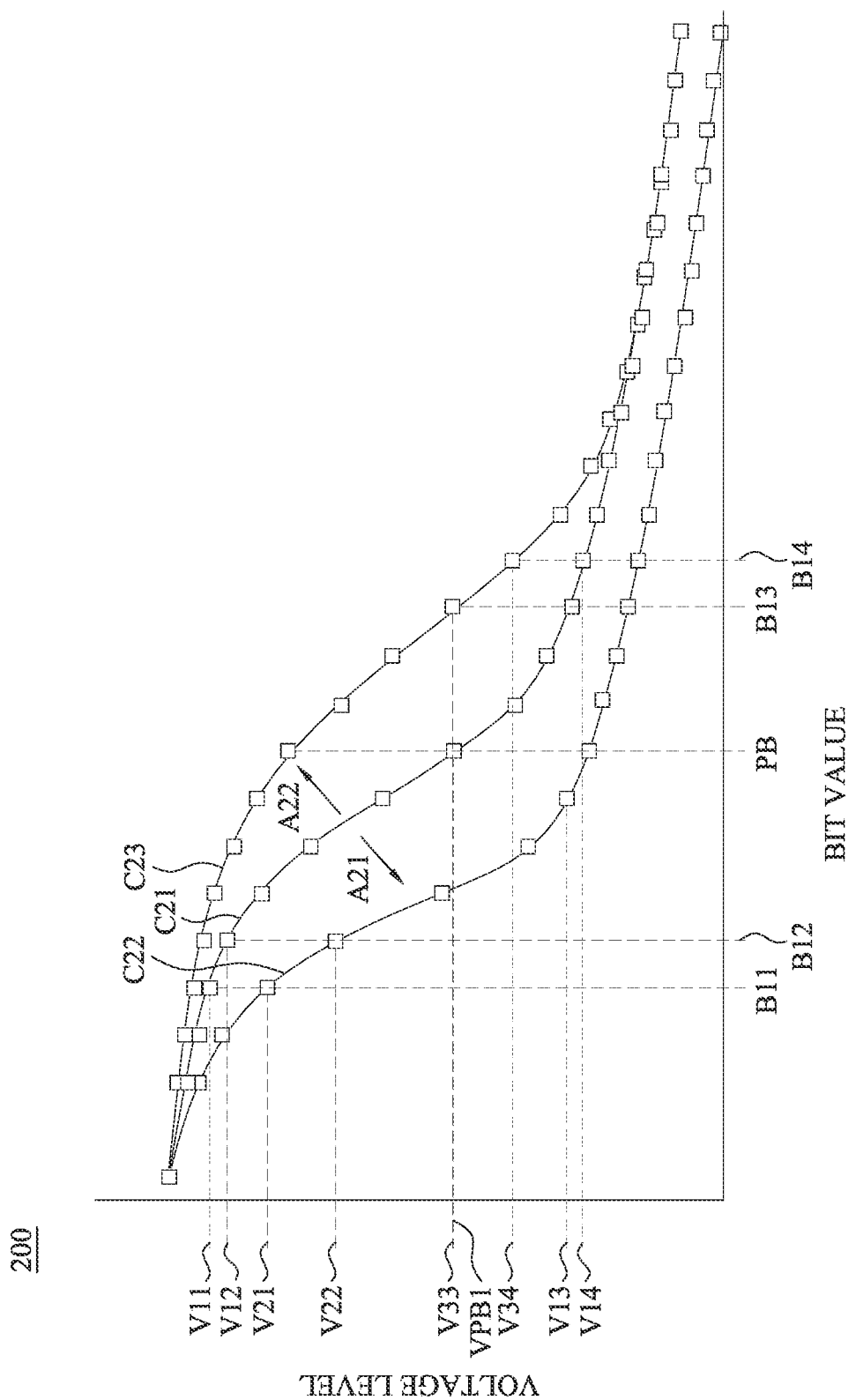
FIG. 2 is a diagram of voltage distribution curves representing relationships between voltage levels of the voltage signals and bit values of the data shown in FIG. 1, in accordance with some embodiments of the present disclosure.

FIG. 2 is a diagram 200 of voltage distribution curves representing relationships between voltage levels of the voltage signals VS1, VS2 and bit values of the data DT shown in FIG. 1, in accordance with some embodiments of the present disclosure. As illustratively shown in FIG. 2, the diagram 200 includes a horizontal axis and a vertical axis. Referring to FIG. 1 and FIG. 2, the horizontal axis corresponds to bit values of the data DT, the vertical axis corresponds to voltage levels of the node N11, or the voltage levels of the voltage signals VS1 and VS2. In some embodiments, the bit values of the data DT are referred to as Multiply Accumulate (MAC) values of the data DT.

As illustratively shown in FIG. 2, the diagram 200 further includes voltage distribution curves C21-C23. The voltage distribution curve C21 corresponds to the relationship between the voltage signal VS1 and the data DT. For example, in response to the data DT having a bit value PB, the voltage signal VS1 has a voltage level VPB1. Similarly, in response to the data DT having bit values B11-B14, the voltage signal VS1 has voltage levels V11-V14 corresponding to the bit values B11-B14, respectively. In the embodiment shown in FIG. 2, the bit values B11 and B12 are smaller than the bit value PB, and the bit values B13 and B14 are larger than the bit value PB. In some embodiments, the bit value PB is a predetermined bit value. In some embodiments, the bit values B11 and B12 are two adjacent bit values, and the bit values B13 and B14 are two adjacent bit values. For example, the bit value B11 is equal to the bit value B12 minus one, and the bit value B14 is equal to the bit value B13 plus one.

As described above in the embodiments shown in FIG. 1, the feedback device 140 adjusts the voltage signal VS1 in different ways in response to different bit values of the data DT, to generate the voltage signal VS2. Referring to FIG. 1 and FIG. 2, in response to the bit value of the data DT being smaller than the bit value PB, the voltage signal VS1 is adjusted along the arrow A21 to generate the voltage signal VS2 corresponding to the voltage distribution curve C22. In other words, the voltage distribution curve C22 has a shift from the voltage distribution curve C21 along the arrow A21, or has a profile different from the voltage distribution curve C21.

Referring to the voltage distribution curve C22 shown in FIG. 2, in response to the data DT having bit values B11 and B12, the voltage signal VS2 has voltage levels V21 and V22, respectively. As illustratively shown in FIG. 2, the voltage level V21 is smaller than the voltage level V11, and the voltage level V22 is smaller than the voltage level V12. In some embodiments, a voltage level difference between the voltage levels V21 and V22 is larger than a voltage level difference between the voltage levels V11 and V12.

Similarly, in response to the bit value of the data DT being larger than the bit value PB, the voltage signal VS1 is adjusted along the arrow A22 to generate the voltage signal VS2 corresponding to the voltage distribution curve C23.

Referring to the voltage distribution curve C23 shown in FIG. 2, in response to the data DT having bit values B13 and B14, the voltage signal VS2 has voltage levels V33 and V34, respectively. As illustratively shown in FIG. 2, the voltage level V33 is larger than the voltage level V13, and the voltage level V34 is larger than the voltage level V14. In some embodiments, a voltage level difference between the voltage levels V33 and V34 is larger than a voltage level difference between the voltage levels V13 and V14.

In some embodiments, in response to the data DT has different bit values, the reading device 120 is configured to generate multiple voltage signals VS1 and multiple voltage signals VS2. For example, one of the voltage signals VS1 corresponds to the bit value PB and has the voltage level VPB1. For another example, one of the voltage signals VS2 corresponds to the bit value B11 and has the voltage level V21.

Referring to FIG. 1 and FIG. 2, the arrows A21 and A22 correspond to the control signals S11 and S12, respectively.

In some embodiments, in response to bit value of the data DT is larger than the bit value PB, the feedback device 140 is configured to adjust the reading circuit 122 by the control signal S12, such that the adjusted reading circuit 122 and the reading circuit 124 cooperate to generate the voltage signal VS2 corresponding to the voltage distribution curve C23. In some embodiments, in response to bit value of the data DT is smaller than the bit value PB, the feedback device 140 is configured to adjust the reading circuit 124 by the control signal S11, such that the reading circuit 122 and the adjusted reading circuit 124 cooperate to generate the voltage signal VS2 corresponding to the voltage distribution curve C22.

In some approaches, a reading device generates a voltage signal based on a bit value of data stored in a memory device. However, a voltage level of the voltage signal is close to another voltage level corresponding to an adjacent bit value. As a result, it is hard to distinguish the bit value from the adjacent bit value based on the voltage signal, and the data cannot be read or identified well.

Compared to the above approaches, in some embodiments of the present disclosure, the voltage signal VS2 is generated based on the bit value of the data DT. The voltage distribution curve is optimized corresponding to the bit value of the data DT, such that a voltage level difference between a voltage level (for example, the voltage level V21) corresponding to a bit value (for example, the bit value B11) and a voltage level (for example, the voltage level V22) corresponding to an adjacent bit value (for example, the bit value B12) is increased. As a result, when the data DT has the bit value B11, it's easy to distinguish the bit value B11 from the bit value B12 based on the voltage signal VS2.

Figure 3A:
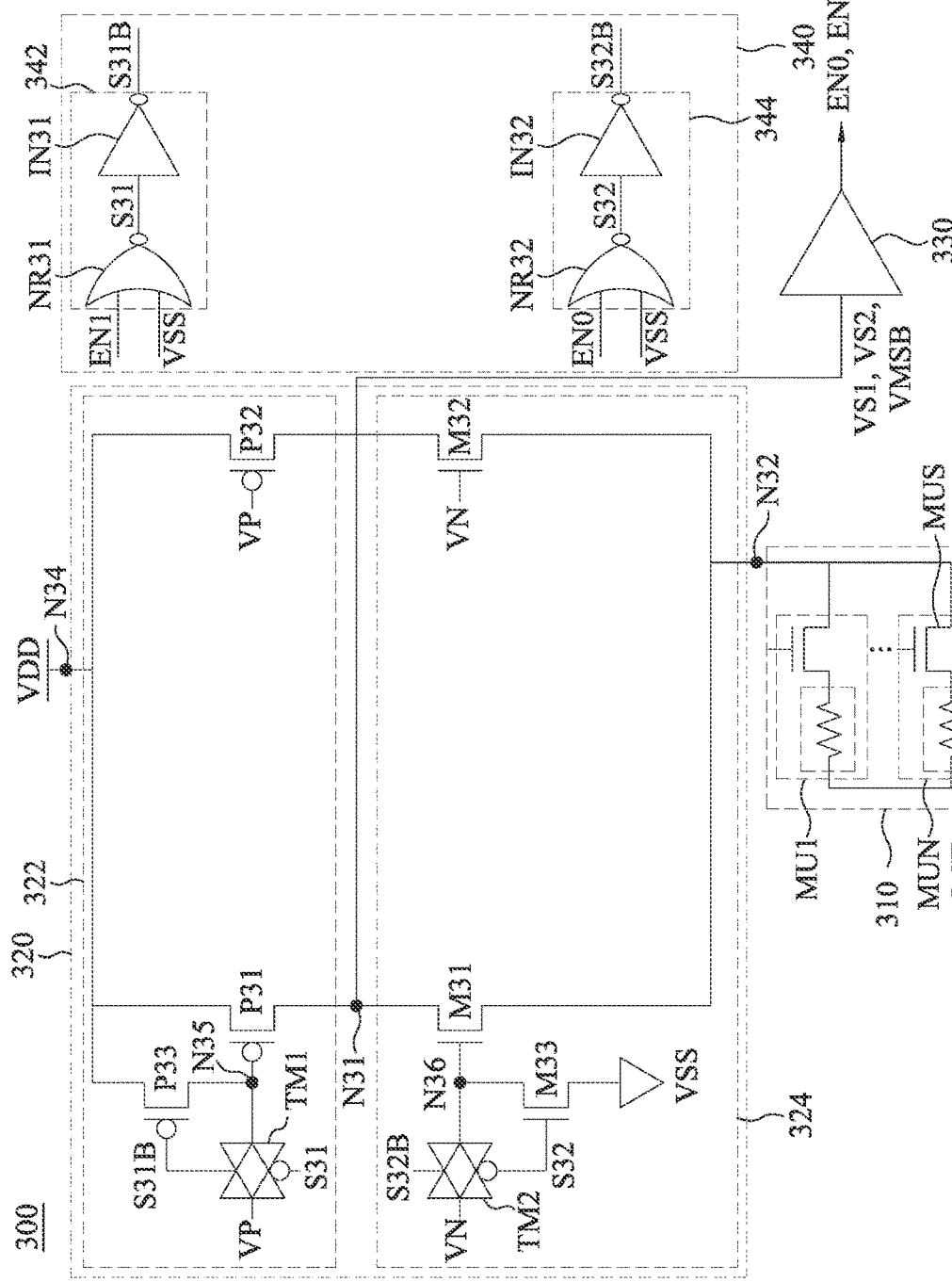
FIG. 3A is a circuit diagram of a memory corresponding to the memory shown in FIG. 1, in accordance with some embodiments of the present disclosure.

FIG. 3A is a circuit diagram of a memory 300 corresponding to the memory 100 shown in FIG. 1, in accordance with some embodiments of the present disclosure. As illustratively shown in FIG. 3A, the memory 300 includes a memory device 310, a reading device 320, a sensing device 330 and a feedback device 340. Referring to FIG. 1 and FIG. 3A, the memory 300 is an embodiment of the memory 100. The memory device 310, the reading device 320, the sensing device 330 and the feedback device 340 correspond to the memory device 110, the reading device 120, the sensing device 130 and the feedback device 140, respectively. Therefore, some descriptions are not repeated for brevity.

As illustratively shown in FIG. 3A, the memory device 110 includes multiple memory units MU1-MUN. It is noted that N is a positive integer. First terminals of the memory units MU1-MUN are couple to the reading device at a node N32, second terminals of the memory units MU1-MUN are configured to receive the voltage signal VSS at a node N33. In other words, the memory units MU1-MUN are coupled in parallel between the nodes N32 and N33. In some embodiments, each of the memory units MU1-MUN is configured to store one or more corresponding bits of the data DT. For example, the memory unit MU1 stores at least one MSB of the data DT.

In some embodiments, each of the memory units MU1-MUN includes a phase change element PCE and a switch MUS. As illustratively shown in FIG. 3A, the phase change element PCE and the switch MUS are coupled in series between the nodes N32 and N33.

In some embodiments, the reading device 320 includes reading circuits 322 and 324. Referring to FIG. 1 and FIG. 3A, the reading circuits 322 and 324 are embodiments of the reading circuits 122 and 124. Therefore, some descriptions are not repeated for brevity.

As illustratively shown in FIG. 3A, the reading circuit 322 is configured to receive the voltage signal VDD at a node N34, and the reading circuit 324 is coupled to the node N32. In some embodiments, the reading circuits 322 and 324 are configured to cooperate with each other to generate the voltage signals VS1, VS2 and VMSB at the node N31.

As illustratively shown in FIG. 3A, the reading circuit 322 includes transistors P31-P33 and a switch TM1. In some embodiments, the transistors P31-P33 are implemented as PMOS transistors, and the switch TM1 is implemented as a transmission gate.

As illustratively shown in FIG. 3A, a terminal of the transistor P31 is coupled to the node N34, another terminal of the transistor P31 is coupled to the node N31. A terminal of the transistor P32 is coupled to the node N34, another terminal of the transistor P32 is coupled to the node N31, a control terminal of the transistor P32 is configured to receive the enable voltage signal VP. A terminal of the transistor P33 is configured to receive the voltage signal VDD, another terminal of the transistor P33 is coupled to a control terminal of the transistor P31 at a node N35, a control terminal of the transistor P33 is configured to receive a control signal S31B. A terminal of the switch TM1 is coupled to the node N35, another terminal of the switch TM1 is configured to receive the enable voltage signal VP, a control terminal of the switch TM1 is configured to receive the control signal S31B, another control terminal of the switch TM1 is configured to receive a control signal S31. In some embodiments, the control signal S31 is complementary to the control signal S31B.

In some embodiments, the control terminal of the transistor P33 and the control terminal of the switch TM1 that receives the control signal S31B are different types. Accordingly, the transistor P33 is turned off when the switch TM1 is turned on, and the transistor P33 is turned on when the switch TM1 is turned off.

In some embodiments, when the control signal S31 has a first voltage level, the switch TM1 is turned on to transmit the enable voltage signal VP to the node N35, such that the transistor P31 is turned on. In some embodiments, the first voltage level is an enable voltage level for P-type transistor, and is a disable voltage level for N-type transistor. When the control signal S31B has the first voltage level, the transistor P33 is turned on to transmit the voltage signal VDD having a disable voltage level to the node N35, such that the transistor P31 is turned off. In other words, the transistor P31 is controlled by the control signals S31 and S31B. Embodiments for controlling the transistor P31 are not limited to the configuration shown in FIG. 3A, other configurations for controlling the transistor P31 based on the control signals S31 and S31B are contemplated as being within the scope of the present disclosure.

As illustratively shown in FIG. 3A, the reading circuit 324 includes transistors M31-M33 and a switch TM2. In some embodiments, the transistors M31-M33 are implemented as NMOS transistors, and the switch TM2 is implemented as a transmission gate.

As illustratively shown in FIG. 3A, a terminal of the transistor M31 is coupled to the node N32, another terminal of the transistor M31 is coupled to the node N31. A terminal of the transistor M32 is coupled to the node N32, another terminal of the transistor M32 is coupled to the node N31, a control terminal of the transistor M32 is configured to receive an enable voltage signal VN. A terminal of the transistor M33 is configured to receive the voltage signal VSS, another terminal of the transistor M33 is coupled to a control terminal of the transistor M31 at a node N36, a control terminal of the transistor M33 is configured to receive a control signal S32. A terminal of the switch TM2 is coupled to the node N36, another terminal of the switch TM2 is configured to receive the enable voltage signal VN, a control terminal of the switch TM2 is configured to receive the control signal S32B, and another control terminal of the switch TM2 is configured to receive a control signal S32.

In some embodiments, the control terminal of the transistor M33 and the control terminal of the switch TM2 that receives the control signal S32 are different types. Accordingly, the transistor M33 is turned off when the switch TM2 is turned on, and the transistor M33 is turned on when the switch TM2 is turned off.

In some embodiments, when the control signal S32B has a second voltage level, the switch TM2 is turned on to transmit the enable voltage signal VN to the node N36, such that the transistor M31 is turned on. In some embodiments, the second voltage level is an enable voltage level for N-type transistor, and is a disable voltage level for P-type transistor. When the control signal S32 has the second voltage level, the transistor M33 is turned on to transmit the voltage signal VSS having a disable voltage level to the node N36, such that the transistor M31 is turned off. In other words, the transistor M31 is controlled by the control signals S32 and S32B. Embodiments for controlling the transistor M31 are not limited to the configuration shown in FIG. 3A, other configurations for controlling the transistor M31 based on the control signals S32 and S32B are contemplated as being within the scope of the present disclosure.

In some embodiments, when the transistors P31 and M31 are turned off, the transistors P32 and M32 are configured to generate the voltage signal VS1 based on the data DT. The voltage levels of the voltage signal VS1 depend on resistance of the transistors P32 and M32. When the transistor P31 is turned on and the transistor M31 is turned off, the transistors P31, P32 and M32 are configured to generate the voltage signal VS2 based on the data DT. The transistors P31 and P32 are coupled in parallel between the nodes N34 and N31, such that a resistance between the nodes N34 and N31 is decreased comparing with a condition that the transistor P31 is turned off. Accordingly, the voltage levels of the voltage signal VS2 are higher than the voltage levels of the voltage signal VS1. Referring to FIG. 3A and FIG. 2, the voltage distribution curve C23 corresponds to a condition that the transistor P31 is turned on.

Similarly, when the transistor M31 is turned on and the transistor P31 is turned off, the transistors M31, P32 and M32 are configured to generate the voltage signal VS2 based on the data DT. The transistors M31 and M32 are coupled in parallel between the nodes N32 and N31, such that a resistance between the nodes N32 and N31 is decreased comparing with a condition that the transistor M31 is turned off. Accordingly, the voltage levels of the voltage signal VS2 are lower than the voltage levels of the voltage signal VS1. Referring to FIG. 3A and FIG. 2, the voltage distribution curve C22 corresponds to a condition that the transistor M31 is turned on.

As illustratively shown in FIG. 3A, the sensing device 330 is configured to sense the voltage signal VMSB to generate digital signals EN0 and EN1. In the embodiment shown in FIG. 3A, the voltage signal VMSB carries a MSB of the data DT. The MSB has a bit value 0 or 1. In response to the MSB having the bit value 0, the digital signal EN0 has a bit value 1 and the digital signal EN1 has a bit value 0. In response to the MSB having the bit value 1, the digital signal EN0 has a bit value 0 and the digital signal EN1 has a bit value 1.

Referring to FIG. 3A and FIG. 2, the bit value of the data DT is larger than the bit value PB when the MSB having the bit value 1, and the bit value of the data DT is smaller than the bit value PB when the MSB having the bit value 0. Accordingly, the feedback device 340 adjusts the voltage signal VS1 along the arrow A21 when the MSB having the bit value 0, and adjusts the voltage signal VS1 along the arrow A22 when the MSB having the bit value 1.

As illustratively shown in FIG. 3A, the feedback device 340 includes logic units 342 and 344. The logic unit 342 is configured to generate the control signals S31 and S31B based on the digital signal EN1 and the voltage signal VSS. The logic unit 344 is configured to generate the control signals S32 and S32B based on the digital signal EN0 and the voltage signal VSS. In some embodiments, the voltage signal VSS has a bit value 0. Referring to FIG. 3A and FIG. 1, the control signals S31 and S31B are embodiments of the control signal S12, and the control signals S32 and S32B are embodiments of the control signal S11.

As illustratively shown in FIG. 3A, the logic unit 342 includes a NOR gate NR31 and an inverter IN31. Two input terminals of the NOR gate NR31 are configured to receive the digital signal EN1 and the voltage signal VSS, respectively. An output terminal of the NOR gate NR31 is configured to output the control signal S31. An input terminal of the inverter IN31 is configured to receive the control signal S31. An output terminal of the inverter IN31 is configured to output the control signal S31B. Accordingly, the control signal S31 has the first voltage level when the digital signal EN1 has the bit value 1, to turn on the switch TM1.

As illustratively shown in FIG. 3A, the logic unit 344 includes a NOR gate NR32 and an inverter IN32. Two input terminals of the NOR gate NR32 are configured to receive the digital signal EN0 and the voltage signal VSS, respectively. An output terminal of the NOR gate NR32 is configured to output the control signal S32. An input terminal of the inverter IN32 is configured to receive the control signal S32. An output terminal of the inverter IN32 is configured to output the control signal S31B. Accordingly, the control signal S32 has the first voltage level when the digital signal EN0 has the bit value 1, to turn on the switch TM2.

In various embodiments, the logic units 342 and 344 have various configurations and include various logic elements. For example, in some alternative embodiments, the logic units 342 and/or 344 have configurations similar with a logic unit 301 shown in FIG. 3B.

Figure 3B:
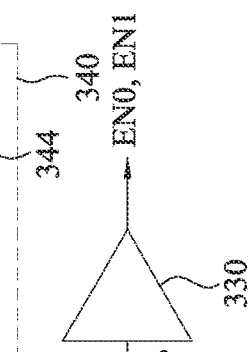
FIG. 3B is a circuit diagram of a logic unit corresponding to the logic units shown in FIG. 3A, in accordance with some embodiments of the present disclosure.

FIG. 3B is a circuit diagram of the logic unit 301 corresponding to the logic units 342 and 344 shown in FIG. 3A, in accordance with some embodiments of the present disclosure. As illustratively shown in FIG. 3B, the logic unit 301 includes an OR gate RB and an inverter INB.

In some embodiments, the logic unit 342 has configurations similar with a logic unit 301. In such embodiments, two input terminals of the OR gate RB are configured to receive the digital signal EN1 and the voltage signal VSS, respectively. An output terminal of the OR gate RB is configured to output the control signal S31B. An input terminal of the inverter INB is configured to receive the control signal S31B. An output terminal of the inverter INB is configured to output the control signal S31.

Similarly, in some embodiments, the logic unit 344 has configurations similar with a logic unit 301. In such embodiments, the two input terminals of the OR gate RB are configured to receive the digital signal EN0 and the voltage signal VSS, respectively. The output terminal of the OR gate RB is configured to output the control signal S32B. The input terminal of the inverter INB is configured to receive the control signal S32B. The output terminal of the inverter INB is configured to output the control signal S32.

Figure 4:
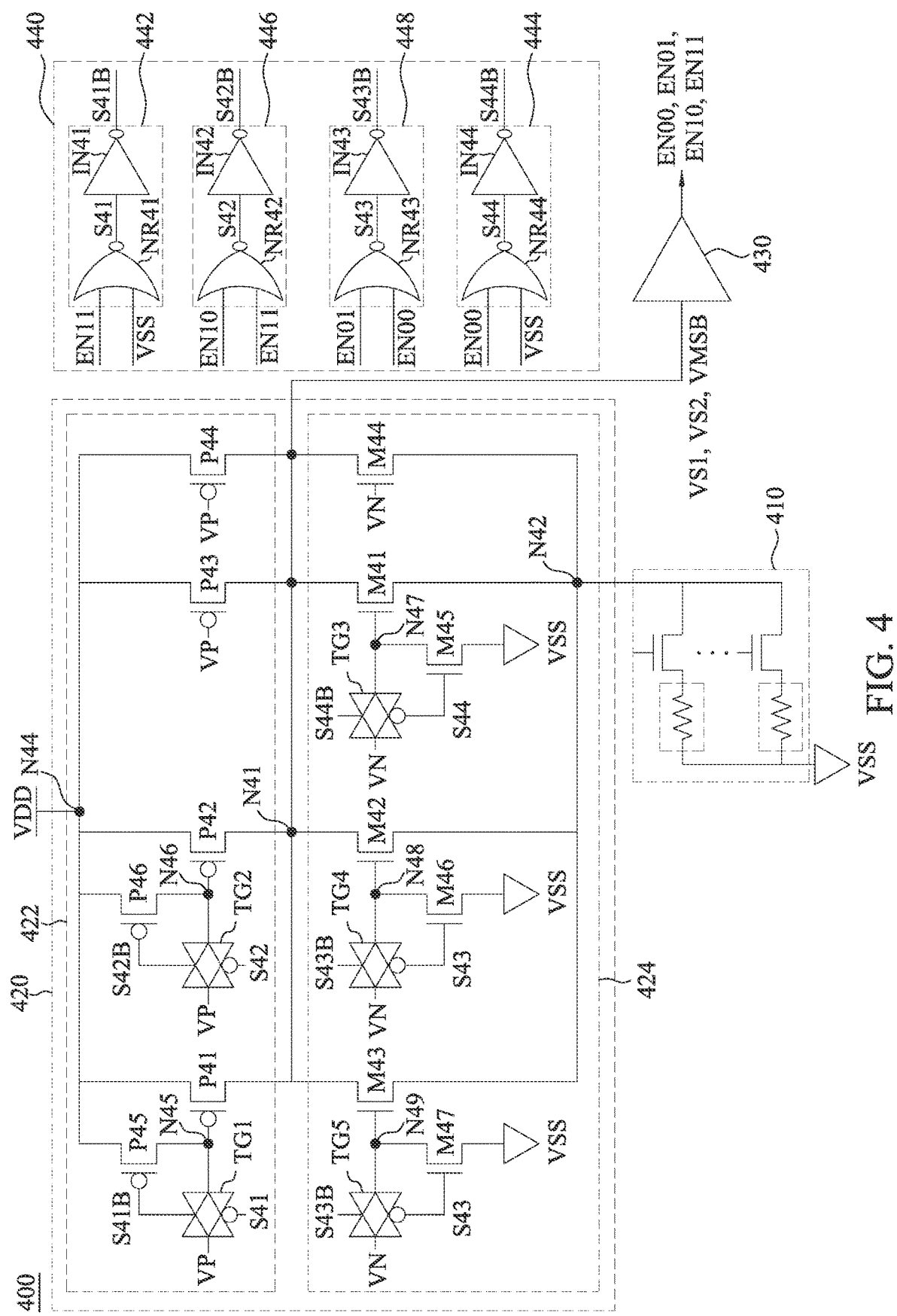
FIG. 4 is a circuit diagram of a memory corresponding to the memory shown in FIG. 1, in accordance with some embodiments of the present disclosure.

FIG. 4 is a circuit diagram of a memory 400 corresponding to the memory 100 shown in FIG. 1, in accordance with some embodiments of the present disclosure. As illustratively shown in FIG. 4, the memory 400 includes a memory device 410, a reading device 420, a sensing device 430 and a feedback device 440. Referring to FIG. 1, FIG. 3A and FIG. 4, the memory 400 is an embodiment of the memory 100 and is an alternative embodiment of the memory 300. The memory device 410, the reading device 420, the sensing device 430 and the feedback device 440 correspond to the memory device 310, the reading device 320, the sensing device 330 and the feedback device 340, respectively. Therefore, some descriptions are not repeated for brevity.

As illustratively shown in FIG. 4, the memory device 410 is configured to receive the voltage signal VSS and is coupled to a node N42. The reading device 420 includes reading circuits 422 and 424. Referring to FIG. 4 and FIG. 3A, the reading circuits 422 and 424 are alternative embodiments of the reading circuits 322 and 324. Therefore, some descriptions are not repeated for brevity.

As illustratively shown in FIG. 4, the reading circuit 422 is configured to receive the voltage signal VDD at a node N44, and the reading circuit 424 is coupled to the node N42. In some embodiments, the reading circuits 422 and 424 are configured to cooperate with each other to generate the voltage signals VS1, VS2 and VMSB at the node N41.

As illustratively shown in FIG. 4, the reading circuit 422 includes transistors P41-P46 and switches TG1, TG2. In some embodiments, the transistors P41-P46 are implemented as PMOS transistors, and the switches TG1, TG2 are implemented as transmission gates.

As illustratively shown in FIG. 4, first terminals of the transistors P41-P44 are coupled to the node N44, second terminals of the transistors P41-P44 are coupled to the node N41. In other words, the transistors P41-P44 are coupled in parallel between the nodes N41 and N44. Control terminals of the transistors P43-P44 are configured to receive the enable voltage signal VP.

As illustratively shown in FIG. 4, a terminal of the transistor P45 is configured to receive the voltage signal VDD, another terminal of the transistor P45 is coupled to a control terminal of the transistor P41 at a node N45, a control terminal of the transistor P45 is configured to receive a control signal S41B. A terminal of the switch TG1 is coupled to the node N45, another terminal of the switch TG1 is configured to receive the enable voltage signal VP, a control terminal of the switch TG1 is configured to receive the control signal S41B, and another control terminal of the switch TG1 is configured to receive a control signal S41. In some embodiments, the control signal S41 is complementary to the control signal S41B.

As illustratively shown in FIG. 4, a terminal of the transistor P46 is configured to receive the voltage signal VDD, another terminal of the transistor P46 is coupled to a control terminal of the transistor P42 at a node N46, a control terminal of the transistor P46 is configured to receive a control signal S42B. A terminal of the switch TG2 is coupled to the node N46, another terminal of the switch TG2 is configured to receive the enable voltage signal VP, a control terminal of the switch TG2 is configured to receive the control signal S42B, and another control terminal of the switch TG2 is configured to receive a control signal S42. In some embodiments, the control signal S42 is complementary to the control signal S42B.

Operations of the transistors P41, P45 and the switch TG1 based on the control signals S41 and S41B are similar with the operations of the transistors P31, P33 and the switch TM1 based on the control signals S31 and S31B shown in FIG. 3A. Operations of the transistors P42, P46 and the switch TG2 based on the control signals S42 and S42B are similar with the operations of the transistors P31, P33 and the switch TM1 based on the control signals S31 and S31B shown in FIG. 3A. Therefore, some descriptions are not repeated for brevity.

As illustratively shown in FIG. 4, the reading circuit 424 includes transistors M41-M47 and switches TG3-TG5. In some embodiments, the transistors M41-M47 are implemented as NMOS transistors, and the switches TG3-TG5 are implemented as transmission gates.

As illustratively shown in FIG. 4, first terminals of the transistors M41-M44 are coupled to the node N42, second terminals of the transistors M41-M44 are coupled to the node N41. In other words, the transistors M41-M44 are coupled in parallel between the nodes N41 and N42. A control terminal of the transistor M44 is configured to receive the enable voltage signal VN.

As illustratively shown in FIG. 4, a terminal of the transistor M45 is configured to receive the voltage signal VSS, another terminal of the transistor M45 is coupled to a control terminal of the transistor M41 at a node N47, a control terminal of the transistor M45 is configured to receive a control signal S44. A terminal of the switch TG3 is coupled to the node N47, another terminal of the switch TG3 is configured to receive the enable voltage signal VN, a control terminal of the switch TG3 is configured to receive the control signal S44B, and another control terminal of the switch TG3 is configured to receive a control signal S44. In some embodiments, the control signal S44 is complementary to the control signal S44B.

As illustratively shown in FIG. 4, a terminal of the transistor M46 is configured to receive the voltage signal VSS, another terminal of the transistor M46 is coupled to a control terminal of the transistor M42 at a node N48, a control terminal of the transistor M46 is configured to receive a control signal S43. A terminal of the switch TG4 is coupled to the node N48, another terminal of the switch TG4 is configured to receive the enable voltage signal VN, a control terminal of the switch TG4 is configured to receive the control signal S43, and another control terminal of the switch TG4 is configured to receive a control signal S43B. In some embodiments, the control signal S43 is complementary to the control signal S43B.

As illustratively shown in FIG. 4, a terminal of the transistor M47 is configured to receive the voltage signal VSS, another terminal of the transistor M47 is coupled to a control terminal of the transistor M43 at a node N49, a control terminal of the transistor M47 is configured to receive the control signal S43. A terminal of the switch TG5 is coupled to the node N49, another terminal of the switch TG5 is configured to receive the enable voltage signal VN, a control terminal of the switch TG5 is configured to receive the control signal S43, and another control terminal of the switch TG5 is configured to receive the control signal S43B.

Operations of the transistors M41, M45 and the switch TG3 based on the control signals S44 and S44B are similar with the operations of the transistors M31, M33 and the switch TM2 based on the control signals S32 and S32B shown in FIG. 3A. Operations of the transistors M42, M46 and the switch TG4 based on the control signals S43 and S43B are similar with the operations of the transistors M31, M33 and the switch TM2 based on the control signals S32 and S32B shown in FIG. 3A. Operations of the transistors M43, M47 and the switch TG5 based on the control signals S43 and S43B are similar with the operations of the transistors M31, M33 and the switch TM2 based on the control signals S32 and S32B shown in FIG. 3A. Therefore, some descriptions are not repeated for brevity.

In various embodiments, each of the reading circuits 422 and 424 includes various numbers of transistors according to electric features of the transistors and specifications of the reading circuits 422 and 424.

As illustratively shown in FIG. 4, the sensing device 430 is configured to sense the voltage signal VMSB to generate digital signals EN00, EN01, EN10 and EN11. In the embodiment shown in FIG. 4, the voltage signal VMSB carries two MSB of the data DT. Each of the two MSB has a bit value 0 or 1. The two MSB have a bit value 00, 01, 10 or 11. In response to the two MSB having the bit value 00, the digital signal EN00 has a bit value 1 and each of the digital signals EN01, EN10 and EN11 has a bit value 0. In response to the MSB having the bit value 01, the digital signal EN01 has a bit value 1 and each of the digital signals EN00, EN10 and EN11 has a bit value 0. In response to the MSB having the bit value 10, the digital signal EN10 has a bit value 1 and each of the digital signals EN00, EN01 and EN11 has a bit value 0. In response to the MSB having the bit value 11, the digital signal EN11 has a bit value 1 and each of the digital signals EN00, EN10 and EN01 has a bit value 0.

Referring to FIG. 4 and FIG. 2, the bit value of the data DT is larger than the bit value PB when the two MSB having the bit value 11 or 10, and the bit value of the data DT is smaller than the bit value PB when the two MSB having the bit value 00 or 01. Accordingly, the feedback device 440 adjusts the voltage signal VS1 along the arrow A21 when the two MSB having the bit value 00 or 01, and adjusts the voltage signal VS1 along the arrow A22 when the two MSB having the bit value 11 or 10.

As illustratively shown in FIG. 4, the feedback device 440 includes logic units 442, 444, 446 and 448. The logic unit 442 is configured to generate the control signals S41 and S41B based on the digital signal EN11 and the voltage signal VSS. The logic unit 444 is configured to generate the control signals S44 and S44B based on the digital signal EN00 and the voltage signal VSS. In some embodiments, the voltage signal VSS has a bit value 0. As illustratively shown in FIG. 4, the logic unit 446 is configured to generate the control signals S42 and S42B based on the digital signals EN11 and EN10. The logic unit 448 is configured to generate the control signals S43 and S43B based on the digital signals EN00 and EN01. Referring to FIG. 4 and FIG. 1, the control signals S41, S41B, S42 and S42B are embodiments of the control signal S12, and the control signals S43, S43B, S44 and S44B are embodiments of the control signal S11.

As illustratively shown in FIG. 4, the logic unit 442 includes a NOR gate NR41 and an inverter IN41. Two input terminals of the NOR gate NR41 are configured to receive the digital signal EN11 and the voltage signal VSS, respectively. An output terminal of the NOR gate NR41 is configured to output the control signal S41. An input terminal of the inverter IN41 is configured to receive the control signal S41. An output terminal of the inverter IN41 is configured to output the control signal S41B. Accordingly, the control signal S41 has the first voltage level when the digital signal EN11 has the bit value 1, to turn on the switch TG1.

As illustratively shown in FIG. 4, the logic unit 444 includes a NOR gate NR44 and an inverter IN44. Two input terminals of the NOR gate NR44 are configured to receive the digital signal EN00 and the voltage signal VSS, respectively. An output terminal of the NOR gate NR44 is configured to output the control signal S44. An input terminal of the inverter IN44 is configured to receive the control signal S44. An output terminal of the inverter IN44 is configured to output the control signal S44B. Accordingly, the control signal S44 has the first voltage level when the digital signal EN00 has the bit value 1, to turn on the switch TG3.

As illustratively shown in FIG. 4, the logic unit 446 includes a NOR gate NR42 and an inverter IN42. Two input terminals of the NOR gate NR42 are configured to receive the digital signals EN11 and EN10, respectively. An output terminal of the NOR gate NR42 is configured to output the control signal S42. An input terminal of the inverter IN42 is configured to receive the control signal S42. An output terminal of the inverter IN42 is configured to output the control signal S42B. Accordingly, the control signal S42 has the first voltage level when one of the digital signals EN11 and EN10 has the bit value 1, to turn on the switch TG2.

As illustratively shown in FIG. 4, the logic unit 448 includes a NOR gate NR43 and an inverter IN43. Two input terminals of the NOR gate NR43 are configured to receive the digital signals EN00 and EN01, respectively. An output terminal of the NOR gate NR43 is configured to output the control signal S43. An input terminal of the inverter IN43 is configured to receive the control signal S43. An output terminal of the inverter IN43 is configured to output the control signal S43B. Accordingly, the control signal S43 has the first voltage level when one of the digital signals EN11 and EN10 has the bit value 1, to turn on the switches TG4 and TG5.

In various embodiments, the logic units 442, 444, 446 and 448 have various configurations and include various logic elements. For example, in some alternative embodiments, the logic units 442, 444, 446 and/or 448 have configurations similar with a logic unit 301 shown in FIG. 3B.

Further details of operations of the memory 400 are described below with embodiments shown in FIG. 5, FIG. 6A, FIG. 6B, FIG. 6C and FIG. 6D.

Figure 5:
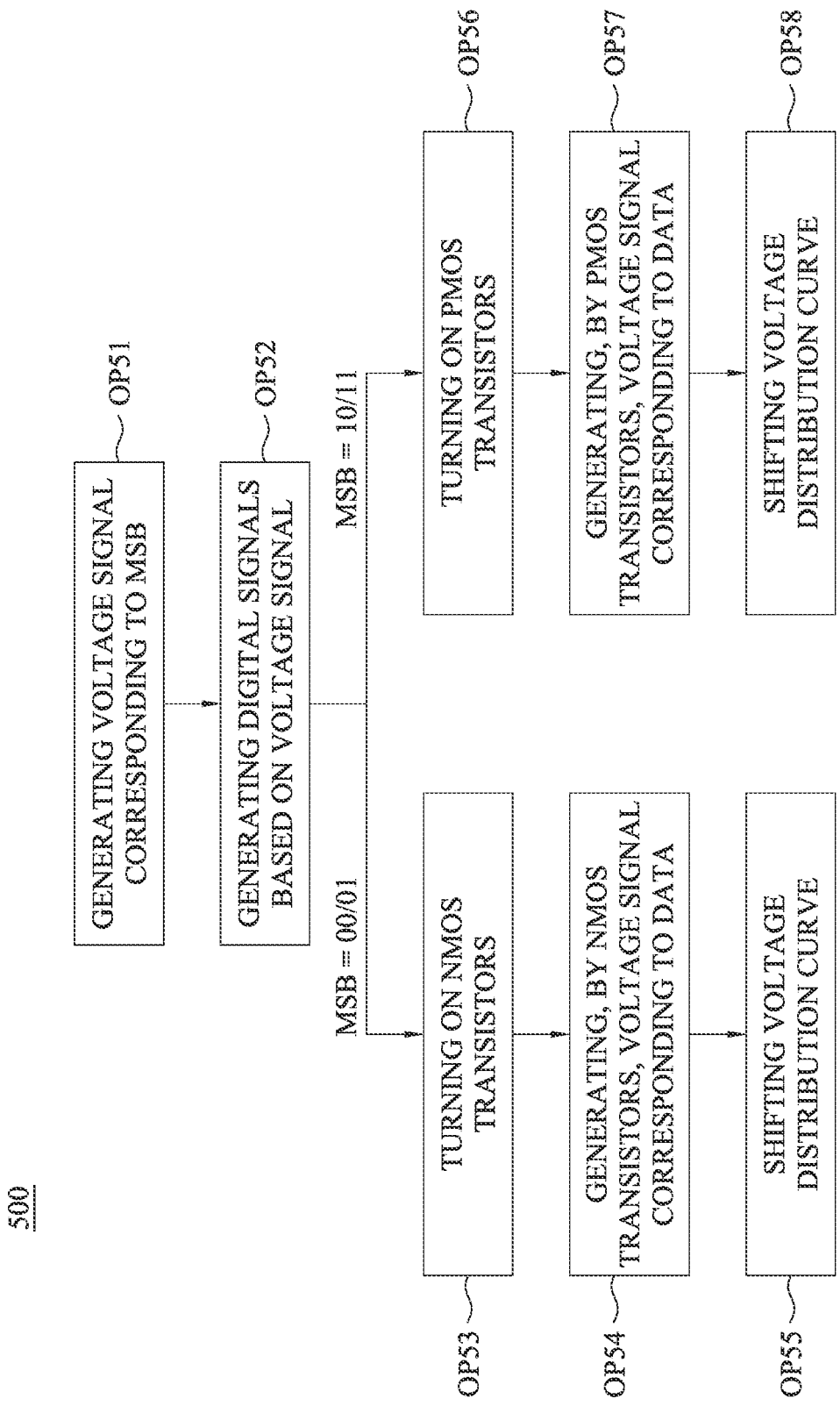
FIG. 5 is a flowchart of a method of memories shown in FIG. 1, FIG. 3A and FIG. 4 generating the voltage signal, in accordance with some embodiments of the present disclosure.

FIG. 5 is a flowchart of a method 500 of memories 100, 300 and 400 shown in FIG. 1, FIG. 3A and FIG. 4 generating the voltage signal VS2, in accordance with some embodiments of the present disclosure. As illustratively shown in FIG. 5, the method 500 includes operations OP51-OP58.

At the operation OP51, a voltage signal VMSB corresponding to one or more MSB of the data DT is generated. At the operation OP52, the digital signals EN00, EN01, EN10 and EN1 are generated based on the voltage signal VMSB.

In response to the voltage signal VMSB having the bit value 00 or 01, the operations OP53-OP55 are performed. In response to the voltage signal VMSB having the bit value 11 or 10, the operations OP56-OP58 are performed.

At the operation OP53, the control signals S43 and S44 are generated to turn on at least one of the transistors M41-M43. Accordingly, a resistance of the reading circuit 424 is decreased.

At the operation OP54, the voltage signal VS2, which has voltage levels lower than the voltage levels of the voltage signal VS1, is generated by the at least one of the transistors M41-M43. Accordingly, at the operation OP55, a voltage distribution curve of the voltage signal VS2 is shifted along the arrow A21 shown in FIG. 2.

At the operation OP56, the control signals S41 and S42 are generated to turn on at least one of the transistors P41-P42. Accordingly, a resistance of the reading circuit 422 is decreased.

At the operation OP57, the voltage signal VS2, which has voltage levels higher than the voltage levels of the voltage signal VS1, is generated by the at least one of the transistors P41-P42. Accordingly, at the operation OP58, the voltage distribution curve of the voltage signal VS2 is shifted along the arrow A22 shown in FIG. 2.

Figures 6A, 6B:
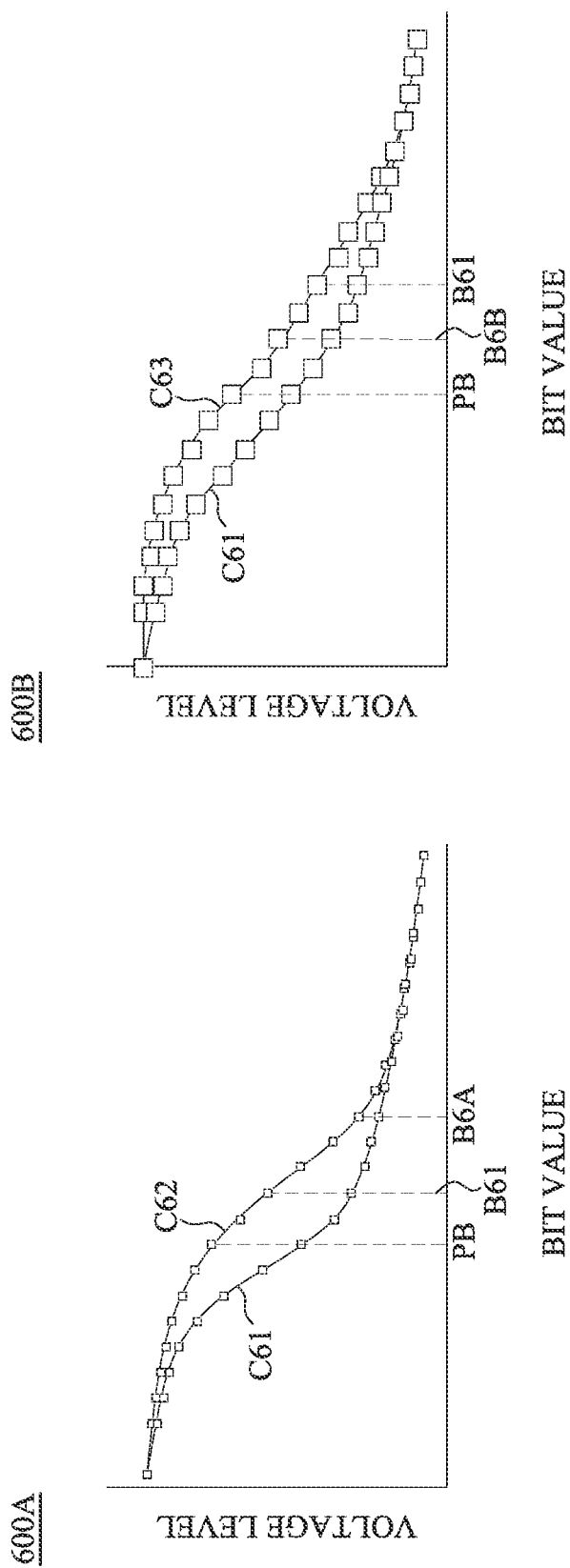
FIG. 6A and FIG. 6B are diagrams of voltage distribution curves representing relationships between voltage levels of the voltage signals and bit values of the data shown in FIG. 4, in accordance with some embodiments of the present disclosure.

FIG. 6A and FIG. 6B are diagrams 600A and 600B of voltage distribution curves representing relationships between voltage levels of the voltage signals VS1, VS2 and bit values of the data DT shown in FIG. 4, in accordance with some embodiments of the present disclosure. Referring to FIG. 5, FIG. 6A and FIG. 6B, the diagrams 600A and 600B describe further details of the operation OP53.

As illustratively shown in FIG. 6A and FIG. 6B, each of the diagrams 600A and 600B includes a horizontal axis corresponding to the bit values of the data DT and a vertical axis corresponding to the voltage levels of the voltage signals VS1 and VS2.

As illustratively shown in FIG. 6A, the diagram 600A includes voltage distribution curves C61 and C62. The voltage distribution curves C61 and C62 correspond to the voltage signals VS1 and VS2, respectively. In some embodiments, the voltage distribution curve C62 correspond to a condition that the two MSB of the data DT have the bit value 11.

In the embodiment shown in FIG. 6A, the data DT has the bit value B6A which is larger than a bit value B61. In some embodiments, the bit value B61 is a largest bit value with MSB 10, and the bit value PB is a largest bit value with MSB 01. For example, if the data has four bits, the bit value B61 is 1011, the bit value PB is 0111, and the bit value B6A is larger than 1011.

Referring to FIG. 6A and FIG. 4, in response to the voltage signal VMSB having the bit value 11, the digital signal EN11 has a bit value 1 and each of the digital signals EN00, EN10 and EN01 has a bit value 0, such that the control signals S41 and S42 have the first voltage level and the control signals S43 and S44 have the second voltage level. Accordingly, the transistors P41 and P42 are turned on and the transistors M41-M43 are turned off. The transistors P41-P44 and M44 generates the voltage signal VS2 corresponding to the voltage distribution curve C62.

As illustratively shown in FIG. 6B, the diagram 600B includes the voltage distribution curve C61 and a voltage distribution curve C63. The voltage distribution curve C63 corresponds to the voltage signal VS2. In some embodiments, the voltage distribution curve C63 correspond to a condition that the two MSB of the data have the bit value 10.

In the embodiment shown in FIG. 6B, the data DT has the bit value B6B which is smaller than or equal to the bit value B61 and larger than the bit value PB. For example, if the data has four bits, the bit value B61 is 1011 and the bit value PB is 0111, the bit value B6A is larger than 0111 and smaller than or equal to 1011.

Referring to FIG. 6B and FIG. 4, in response to the voltage signal VMSB having the bit value 10, the digital signal EN10 has a bit value 1 and each of the digital signals EN00, EN11 and EN01 has a bit value 0, such that the control signal S42 has the first voltage level and the control signals S41, S43 and S44 have the second voltage level. Accordingly, the transistor P42 is turned on, and the transistors P41, M41-M43 are turned off. The transistors P42-P44 and M44 generates the voltage signal VS2 corresponding to the voltage distribution curve C63.

Referring to FIG. 4, FIG. 6A and FIG. 6B, the resistance of the reading circuit 422 corresponding to the diagram 600A is smaller than the resistance of the reading circuit 422 corresponding to the diagram 600B. Accordingly, the voltage levels of the voltage distribution curve C62 are larger than the voltage levels of the voltage distribution curve C63. In other words, the voltage distribution curve C62 is shifted from the voltage distribution curve C61 by a degree that is larger than a degree of the voltage distribution curve C63 being shifted from the voltage distribution curve C61.

Figures 6C, 6D:
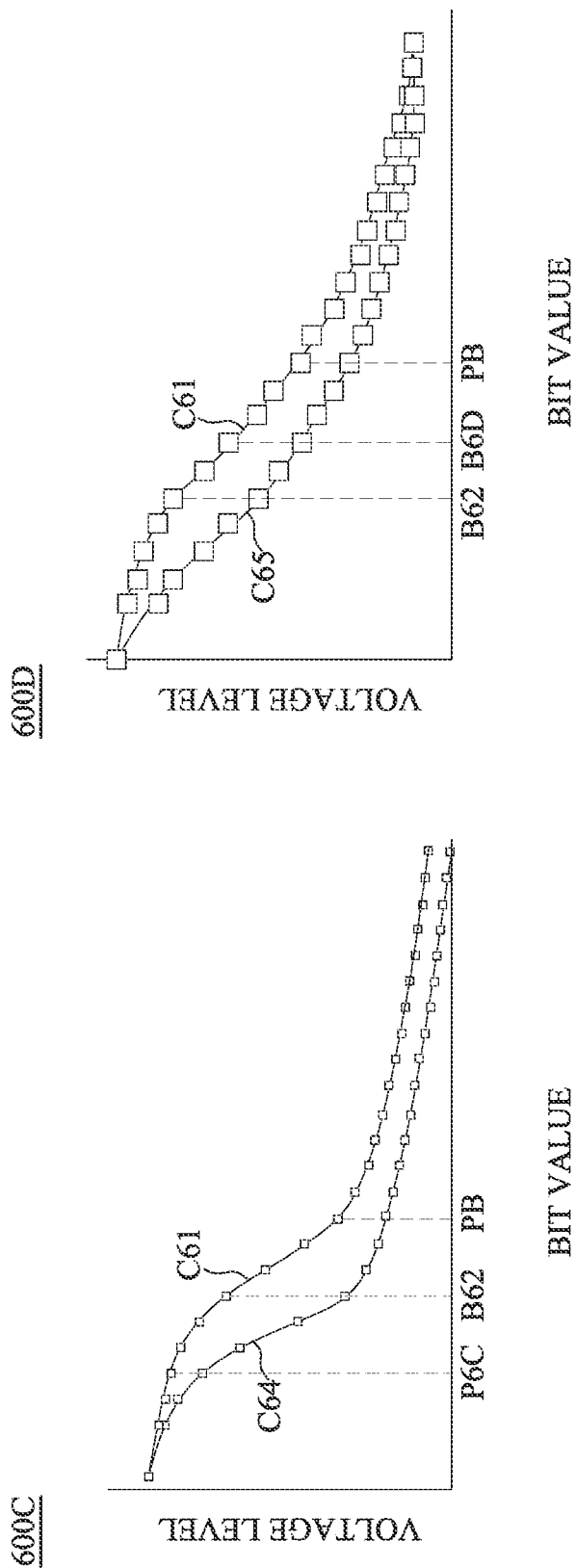
FIG. 6C and FIG. 6D are diagrams of voltage distribution curves representing relationships between voltage levels of the voltage signals and bit values of the data shown in FIG. 4, in accordance with some embodiments of the present disclosure.

FIG. 6C and FIG. 6D are diagrams 600C and 600D of voltage distribution curves representing relationships between voltage levels of the voltage signals VS1, VS2 and bit values of the data DT shown in FIG. 4, in accordance with some embodiments of the present disclosure. Referring to FIG. 5, FIG. 6C and FIG. 6D, the diagrams 600C and 600D describe further details of the operation OP56.

As illustratively shown in FIG. 6C and FIG. 6D, each of the diagrams 600C and 600D includes a horizontal axis corresponding to the bit values of the data DT and a vertical axis corresponding to the voltage levels of the voltage signals VS1 and VS2.

As illustratively shown in FIG. 6C, the diagram 600C includes voltage distribution curves C61 and C64. The voltage distribution curves C61 and C64 correspond to the voltage signals VS1 and VS2, respectively. In some embodiments, the voltage distribution curve C64 correspond to a condition that the two MSB of the data have the bit value 00.

In the embodiment shown in FIG. 6C, the data DT has the bit value B6C which is smaller than a bit value B62. In some embodiments, the bit value B62 is a smallest bit value with MSB 01, and the bit value PB is a largest bit value with MSB 01. For example, if the data has four bits, the bit value B62 is 0100, the bit value PB is 0111, and the bit value B6C is smaller than 0100.

Referring to FIG. 6C and FIG. 4, in response to the voltage signal VMSB having the bit value 00, the digital signal EN00 has a bit value 1 and each of the digital signals EN11, EN10 and EN01 has a bit value 0, such that the control signals S43 and S44 have the first voltage level and the control signals S41 and S42 have the second voltage level. Accordingly, the transistors M41-M43 are turned on and the transistors P41-P42 are turned off. The transistors P43-P44 and M41-M44 generates the voltage signal VS2 corresponding to the voltage distribution curve C64.

As illustratively shown in FIG. 6D, the diagram 600D includes the voltage distribution curve C61 and a voltage distribution curve C65. The voltage distribution curve C65 corresponds to the voltage signal VS2. In some embodiments, the voltage distribution curve C65 correspond to a condition that the two MSB of the data have the bit value 01.

In the embodiment shown in FIG. 6D, the data DT has the bit value B6D which is smaller than or equal to the bit value PB and larger than or equal to the bit value B62. For example, if the data has four bits, the bit value B62 is 0100 and the bit value PB is 0111, the bit value B6A is larger than or equal to 0100 and smaller than or equal to 0111.

Referring to FIG. 6D and FIG. 4, in response to the voltage signal VMSB having the bit value 01, the digital signal EN01 has a bit value 1 and each of the digital signals EN00, EN11 and EN10 has a bit value 0, such that the control signal S43 has the first voltage level and the control signals S41, S42 and S44 have the second voltage level. Accordingly, the transistors M42 and M43 are turned on, and the transistors P41-P42 and M41 are turned off. The transistors P43-P44 and M42-M43 generates the voltage signal VS2 corresponding to the voltage distribution curve C65.

Referring to FIG. 4, FIG. 6C and FIG. 6D, the resistance of the reading circuit 424 corresponding to the diagram 600C is smaller than the resistance of the reading circuit 422 corresponding to the diagram 600D. Accordingly, the voltage levels of the voltage distribution curve C64 are smaller than the voltage levels of the voltage distribution curve C65. In other words, the voltage distribution curve C64 is shifted from the voltage distribution curve C61 by a degree that is larger than a degree of the voltage distribution curve C65 being shifted from the voltage distribution curve C61.

In summary, the voltage signal VS2 is adjusted by different degrees according to different bit value of the MSB of the data, such that the corresponding voltage distribution curves C62-C65 are shifted by different degrees.

Also disclosed is a memory including a memory device, a reading device and a feedback device. The memory device is configured to store a plurality of bits. The reading device includes a first reading circuit and a second reading circuit. The first reading circuit is coupled to the memory device. The second reading circuit is coupled to the memory device, and coupled to the first reading circuit at a first node. The first reading circuit and the second reading circuit are configured to cooperate with each other to generate a first voltage signal at the first node based on at least one first bit of the plurality of bits. The feedback device is configured to adjust at least one of the first reading circuit or the second reading circuit based on the first voltage signal. The first reading circuit and the second reading circuit are configured to generate a second voltage signal, different from the first voltage signal, corresponding to the plurality of bits, after the at least one of the first reading circuit or the second reading circuit is adjusted by the feedback device.

Also disclosed is a memory including a memory device, a reading device, a sensing device and a feedback device. The reading device is coupled to the memory device, and configured to read data stored in the memory device to generate first voltage signals that correspond to a first voltage distribution curve. The sensing device is configured to sense the first voltage signals and to generate digital signals corresponding to the first voltage signals being sensed. The feedback device is configured to generate, in response to the digital signals, at least one control signal for controlling the reading device to generate second voltage signals that correspond to a second voltage distribution curve different from the first voltage distribution curve.

Also disclosed is a method including: generating, by a complementary metal oxide semiconductor (CMOS) circuit, a first voltage signal that is associated with data stored in a memory device, wherein voltage levels of the first voltage signal correspond to a first voltage distribution curve; sensing the first voltage signal to generate digital signals associated with at least one first bit of the data; and controlling, according to the digital signals, the CMOS circuit to generate a second voltage signal, wherein the second voltage signal corresponds to the data, and voltage levels of the second voltage signal correspond to a second voltage distribution curve that has a shift from the first voltage distribution curve or has a profile different from the first voltage distribution curve.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a memory device configured to store a plurality of bits;
   a first switch coupled to the memory device at a first node;
   a second switch configured to control the first switch; and
   a feedback device configured to adjust the second switch based on a first voltage signal generated at the first node,
   wherein each of the first switch and the second switch is configured to receive a reference voltage signal, and
   the first voltage signal is generated based on the plurality of bits.

2. The device of claim 1, further comprising:
   a third switch configured to provide an enable voltage signal to a control terminal of the first switch according to a control signal; and
   a fourth switch coupled in parallel with the first switch and configured to receive the enable voltage signal,
   wherein a control terminal of the second switch is configured to receive the control signal.

3. The device of claim 2, wherein the feedback device comprises:
   an inverter configured to output the control signal, an input terminal of the inverter being coupled to a control terminal of the third switch.

4. The device of claim 1, further comprising:
   a third switch coupled in series with the first switch at the first node; and
   a fourth switch configured to control the first switch,
   wherein the feedback device is further configured to adjust the second switch based on the first voltage signal.

5. The device of claim 4, wherein the feedback device comprises:
   a first logic unit configured generate a control signal and receive a reference voltage signal,
   wherein the fourth switch is further configured to provide the reference voltage signal to a control terminal of the third switch according to the control signal.

6. The device of claim 5, wherein the feedback device further comprises:
   a second logic unit configured to control the second switch and receive the reference voltage signal,
   wherein a logic type of the first logic unit is same as a logic type of the second logic unit.

7. The device of claim 5, further comprising:
   a sensing device configured to generate a first digital signal according to the first voltage signal,
   wherein two input terminals of the first logic unit are configured to receive the first digital signal and the reference voltage signal, respectively.

8. The device of claim 7, wherein in response to a most significant bit of the plurality of bits having a first bit value, the first digital signal has a second bit value different from the first bit value, and
   in response to the most significant bit having the second bit value, the first digital signal has the first bit value.

9. A device, comprising:
   a memory device;
   a first reading circuit coupled to the memory device, and configured to generate a first voltage signal based on data stored in the memory device; and
   a first logic unit configured to adjust the first reading circuit based on the first voltage signal,
   wherein the first reading circuit is configured to generate a second voltage signal, different from the first voltage signal, corresponding to the data, after the first reading circuit is adjusted by the first logic unit.

10. The device of claim 9, further comprising:
a second reading circuit configured to generate the first voltage signal with the first reading circuit;
a second logic unit configured to adjust the second reading circuit based on the first voltage signal; and
a sensing device configured to generate a first digital signal and a second digital signal according to the first voltage signal,
wherein the first logic unit and the second logic unit are configured to receive the first digital signal and the second digital signal, respectively.

11. The device of claim 10, wherein the first digital signal and the second digital signal are complemented from each other.

12. The device of claim 11, wherein a bit value of the first digital signal is same as a most significant bit of the data.

13. The device of claim 10, wherein the second reading circuit comprises:
a first switch coupled between the sensing device and the memory device; and
a second switch configured to provide a reference voltage signal to a control terminal of the first switch,
wherein the second logic unit is further configured to control the second switch and receive the reference voltage signal.

14. The device of claim 13, wherein the first logic unit is further configured to receive the reference voltage signal.

15. The device of claim 9, wherein the first reading circuit comprises:
a first switch and a second switch coupled in parallel between a first node and a second node;
a third switch coupled between a control terminal of the first switch and the second node; and
a fourth switch coupled between a control terminal of the second switch and the second node,
wherein the first voltage signal is generated at the first node.

16. The device of claim 15, further comprising:
a sensing device configured to generate a first digital signal and a second digital signal according to the first voltage signal; and a second logic unit configured to control the fourth switch according to each of the first digital signal and the second digital signal,
wherein the first logic unit is configured to control the third switch according to the first digital signal.

17. The device of claim 16, wherein
in response to two most significant bit of the data having a first bit value, the first digital signal and the second digital signal have a first value and a second value, respectively,
in response to the two most significant bit having a second bit value, the first digital signal and the second digital signal have the second value and the first value, respectively,
in response to the two most significant bit having a third bit value, each of the first digital signal and the second digital signal has the second value,
the first bit value, the second bit value and the third bit value are different from each other, and
the first value is different from the second value.

18. A method, comprising:
generating a first voltage signal at a first node according to data;
generating a first control signal based on the first voltage signal;
inverting the first control signal to generate a second control signal;
receiving each of the first control signal and the second control signal by a first switch;
controlling a second switch by the first switch; and
generating, corresponding to the data, a second voltage signal at the first node by the second switch.

19. The method of claim 18, wherein generating the first control signal comprises:
sensing the first voltage signal to generate a digital signal indicating a most significant bit of the data; and
generating the first control signal according to the digital signal.

20. The method of claim 18, further comprising:
providing a reference voltage signal to the first node; and
providing the reference voltage signal to a control terminal of the second switch according to the second control signal.

* * * * *